(12) United States Patent
Ouellet et al.

(10) Patent No.: US 7,807,550 B2
(45) Date of Patent: Oct. 5, 2010

(54) METHOD OF MAKING MEMS WAFERS

(75) Inventors: Luc Ouellet, Granby (CA); Mamur Chowdhury, Brossard (CA)

(73) Assignee: DALSA Semiconductor Inc., Waterloo, Ontario (CA)

( * ) Notice: Subject to any disclaimer, the term of this patent is extended or adjusted under 35 U.S.C. 154(b) by 528 days.

(21) Appl. No.: 11/424,059

(22) Filed: Jun. 14, 2006

(65) Prior Publication Data
US 2007/0015341 A1    Jan. 18, 2007

Related U.S. Application Data

(60) Provisional application No. 60/691,276, filed on Jun. 17, 2005.

(51) Int. Cl.
H01L 21/30  (2006.01)
H01L 21/46  (2006.01)
(52) U.S. Cl. ............................ 438/456; 438/459
(58) Field of Classification Search ............ 438/455, 438/456, 459
See application file for complete search history.

(56) References Cited

U.S. PATENT DOCUMENTS

| 6,297,072 | B1 | 10/2001 | Tilmans et al. |
| 6,445,053 | B1 | 9/2002 | Cho |
| 6,846,725 | B2* | 1/2005 | Nagarajan et al. ............ 438/456 |
| 6,852,561 | B2* | 2/2005 | Bidard et al. ................. 438/50 |
| 7,230,512 | B1* | 6/2007 | Carpenter et al. ............ 333/193 |
| 7,473,616 | B2* | 1/2009 | Yang .......................... 438/455 |
| 2001/0008795 | A1* | 7/2001 | Terauchi et al. ............. 438/637 |
| 2003/0077877 | A1* | 4/2003 | Hartwell ..................... 438/455 |
| 2004/0259325 | A1* | 12/2004 | Gan .......................... 438/456 |
| 2005/0127499 | A1 | 6/2005 | Harney et al. |

FOREIGN PATENT DOCUMENTS

| DE | 10331322 A1 | 2/2005 |
| EP | 1071126 A2 | 1/2001 |

OTHER PUBLICATIONS

"High Density, High Aspect Ratio Through-Wafer Electrical Interconnect Vias for MEMS Packaging", Seong Joon Ok, et al, IEEE Transactions on Advanced Packaging, Piscataway, NJ, USA, vol. 26, No. 3, Aug. 1, 2003, pp. 302-309, XP011102265, ISSN: 1521-3323.

* cited by examiner

*Primary Examiner*—David A Zarneke
(74) *Attorney, Agent, or Firm*—Marks & Clerk; Richard J. Mitchell (57) ABSTRACT

A wafer level package for a MEMS device is made by bonding a MEMS wafer and a lid wafer together to form a hermetically sealed cavity. One or more vias filled with conductive or semiconductive material is etched one of the wafers to form one or more rods extending through the wafer. The rods provide electrical connection to components within the hermetically sealed cavity.

5 Claims, 11 Drawing Sheets

Fig. 11 — DIRECT WAFER BOND TO MEMS

Fig. 12 — BACKGRIND TO EXPOSE VIAS 1.0 μm PECVD SiO2

Fig. 13

MASK#4: 2.0 μm CONTACTS

Fig. 14

CONTACTS ETCH & STRIP

Fig. 15

0.1μm TiW + 0.5μm AlCu

Fig. 16

MASK#5: 19.0 μm PADS DEFINITION

Fig. 17

STRIP RESIST

Fig. 18

ELECTROLESS PLATING 1.0μm Ni(P)

Fig. 19

ELECTROLESS PLATING 0.1μm Pd(P)

METHOD OF MAKING MEMS WAFERS

CROSS REFERENCE TO RELATED APPLICATION

This application claims the benefit under 35 USC 119(e) of prior U.S. provisional application No. 60/691,276, filed Jun. 17, 2005, the contents of which are herein incorporated by reference.

FIELD OF THE INVENTION

This invention relates to a method of making MEMS wafers, and in particular to a method of obtaining a hermetic seal while providing an electrical connection to components within the sealed wafer.

BACKGROUND OF THE INVENTION

The manufacture of Micro-Electro-Mechanical-Systems (MEMS), such as micro-gyroscopes, micro-accelerometers, resonant accelerometers, RF devices, RF resonators, micro-mirrors, micro-motors, micro-actuators and other such micro-devices integrating at least one moving and/or particular component operating under sub-atmospheric conditions creates a very serious challenge for packaging. The vast majority of MEMS-based devices require the encapsulation to be done before wafer dicing so as to protect against micro-contamination from particles and dicing slurry while the wafers are processed like a standard semiconductor chip, and avoid the need for dedicated equipment or processes for dicing, mounting and molding. Most MEMS-based gyroscopes, MEMS-based accelerometers, MEMS-based inertial sensors, MEMS-based RF switching devices, MEMS-based resonators and other such MEMS devices, which are susceptible to a reduction of performance due to gas-induced damping (reduction of Q-factor) or gas-induced degradation, are influenced by the hermeticity of the packaging.

A sealed package to encapsulate the moving and/or particular components in vacuum or in a controlled atmosphere in a sealed protection micro-cavity is necessary to ensure reliable operation.

This micro-cavity is typically fabricated using microelectronics fabrication technologies to produce, on the wafer itself, a hermetic wafer-level package over each one of the various MEMS devices present on the wafer. Various approaches have been proposed to generate such a sealed wafer-level package, of which only a few permit the fabrication of a truly hermetically sealed hermetic package.

SUMMARY OF THE INVENTION

The present invention provides a novel technique for producing hermetically sealed micro-cavities between a so called "LID wafer" and a so called "MEMS wafer" to control the micro-environment around the MEMS devices.

In accordance with the invention there is provide a method of making a MEMS device from two parts (normally a lid and MEMS body) which are subsequently hermetically sealed together comprising forming a least one via, and preferably an array of vias through one of the parts, made of a material such as silicon, depositing conductive material or semiconductive material, such as phosphorus doped amorphous silicon, in said vias to form rods, and subsequently joining said parts together, preferably using direct contact (such as silicon-silicon) bonding, to provide a sealed cavity with said one or more rods providing a conductive path to the cavity.

The conductive material can suitably be deposited by LPCVD (Low Pressure Chemical Vapor Deposition). Electrical contact can be made to components within the cavity through the one or more rods formed extending through the MEMS body. By forming the rods into arrays, the overall electrical resistance of the path to the cavity can be reduced.

Thus in one aspect the invention provides a method of making a wafer level package for a MEMS device including a MEMS wafer and a lid wafer bonded together to form a hermetically sealed cavity, comprising forming one or more vias filled with conductive or semiconductive material in one of said wafers to form one or more rods extending through said one wafer; and bonding said two wafers together to form a hermetically sealed cavity with said one or more rods providing electrical connection between one or more components within said cavity and a contact pad on an exposed face of said one wafer.

In another aspect the invention provides a method of making a wafer level package for a MEMS device, comprising etching deep vias into a first wafer from a front side thereof; filling said deep vias with conductive or semiconductive material to form rods; providing contact pads on exposed portions of said rods; providing seal rings on said first wafer; providing a second wafer with corresponding contact pads and seal rings; bonding said first and second wafers together to define a hermetically sealed cavity; exposing said rods from the backside of said wafer; and providing contact pads on said rods on the backside of said wafer; wherein said rods provide electrical connection through said first wafer to one or more components within said heremetically sealed cavity.

In yet another aspect the invention provides a MEMS device comprising a MEMS body containing MEMS components; a lid portion bonded to said MEMS body by seal rings to form a hermetically sealed cavity; and one or more conductive or semiconductive rods filling vias extending through the lid portion into the sealed cavity to provide electrical connection to one or more components within the sealed cavity.

In the semiconductive material phosphorus-doped amorphous silicon. Other suitable materials may be used.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
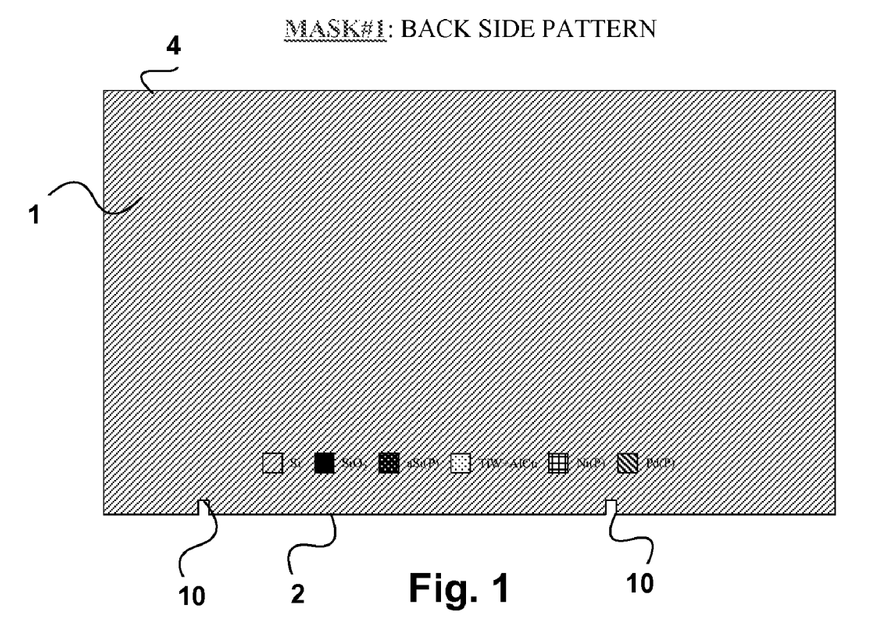
FIG. 1 illustrates the formation of alignment notches in a silicon wafer.

The device accordance to the invention is made using a series of mask steps involving a photoresist masks. FIG. 1 shows a cross section through a silicon substrate 1 that will form the lid wafer of a MEMS device. The lid wafer starts off as a 600 μm DSP (double sided polished)wafer.

Figure 10:
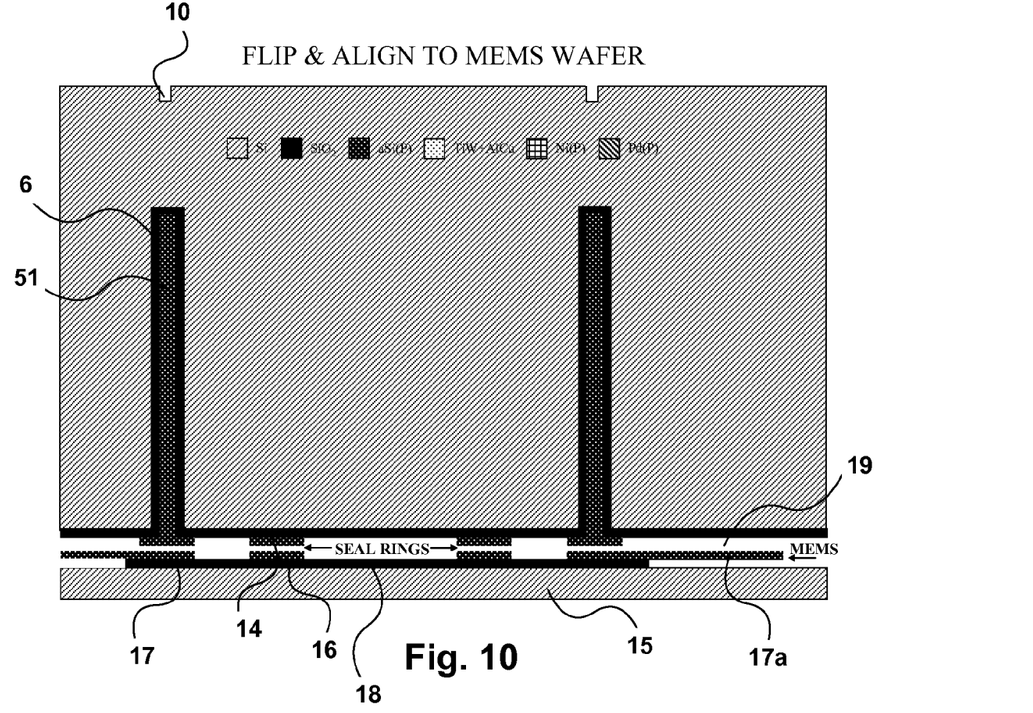
FIG. 10 shows the alignment of the wafer to a MEMS wafer.

In a first step, a first mask (not shown) is applied to the backside 2 of the substrate 1 to form notches 10 that will serve as alignment marks. The notches 10 are formed under locations where vias are to be formed on the front side of the wafer. They are subsequently used for alignment purposes when the two wafers are brought together, as shown in FIG. 10, to ensure proper alignment.

Figure 2:
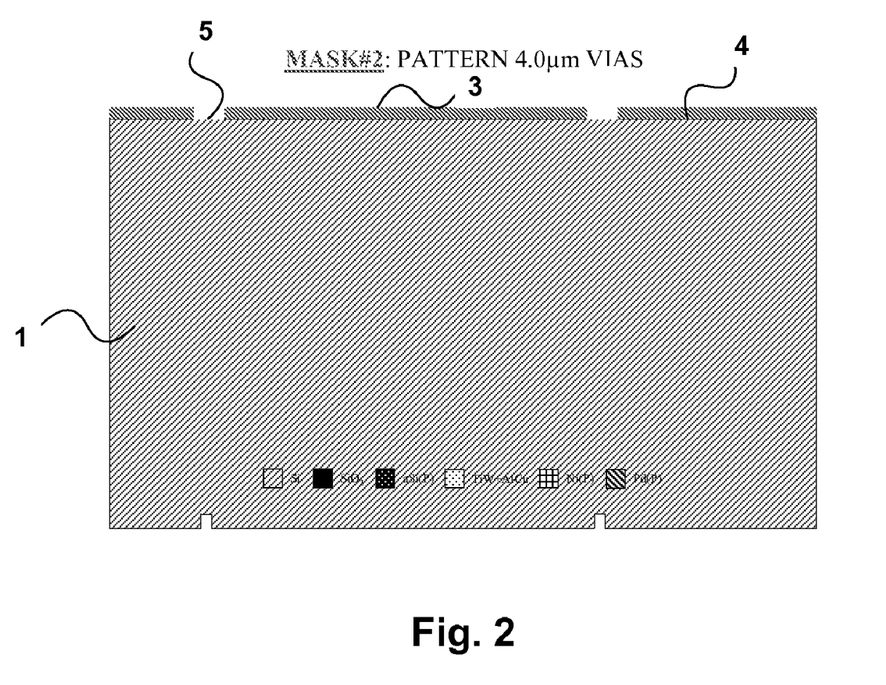
FIG. 2 shows the patterning of the front side of the wafer.
Figure 3:
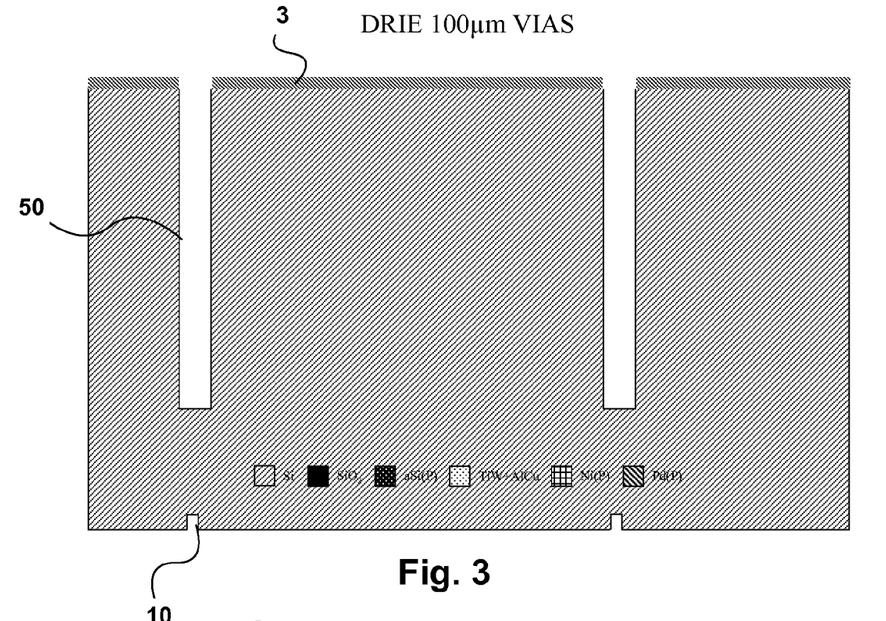
FIG. 3 illustrates the formation of deep vias.

In a second step (FIG. 2) a photoresist mask 3 is applied to the front side 4 of the substrate 1 to pattern 4.0 μm via openings 5. In a third step (FIG. 3), a deep reaction ion etch is performed to form the vias 50 extending 100 μm into the substrate 1.

Figure 4:
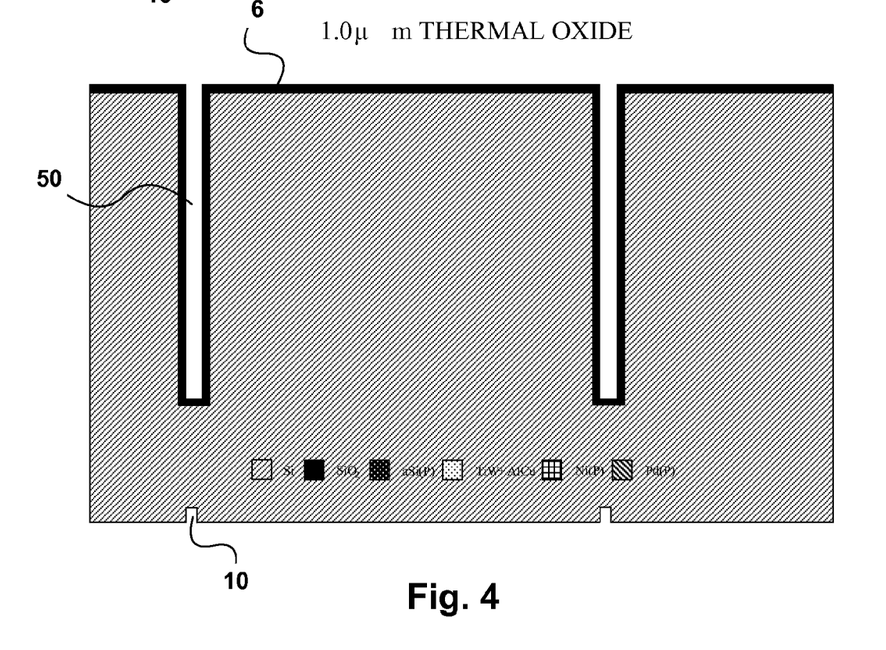
FIG. 4 illustrates the deposition of a thermal oxide layer.
Figure 5:
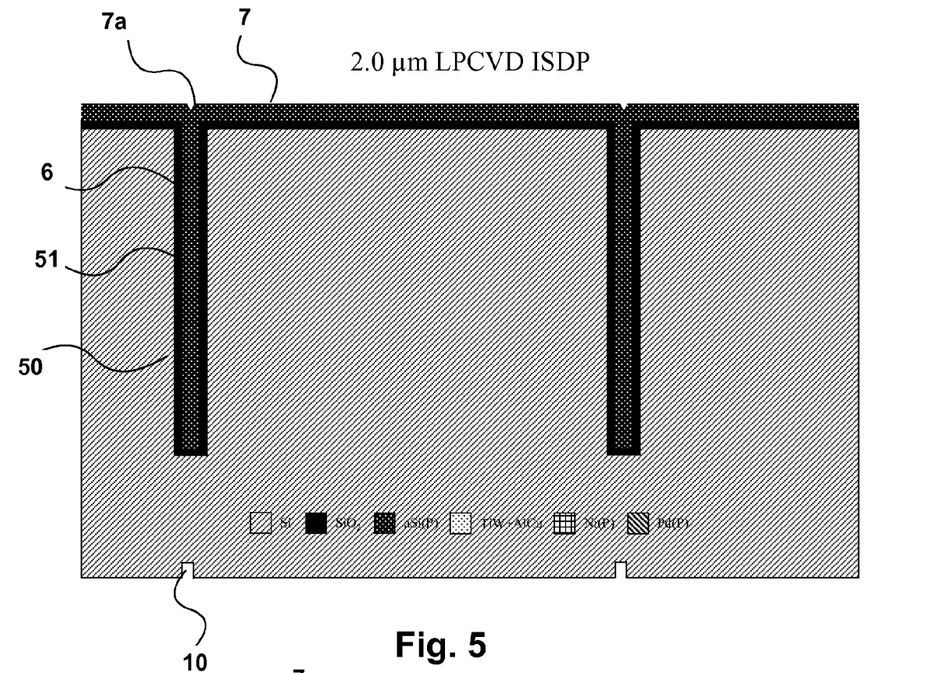
FIG. 5 illustrates the deposition of an ISDP layer.
Figure 6:
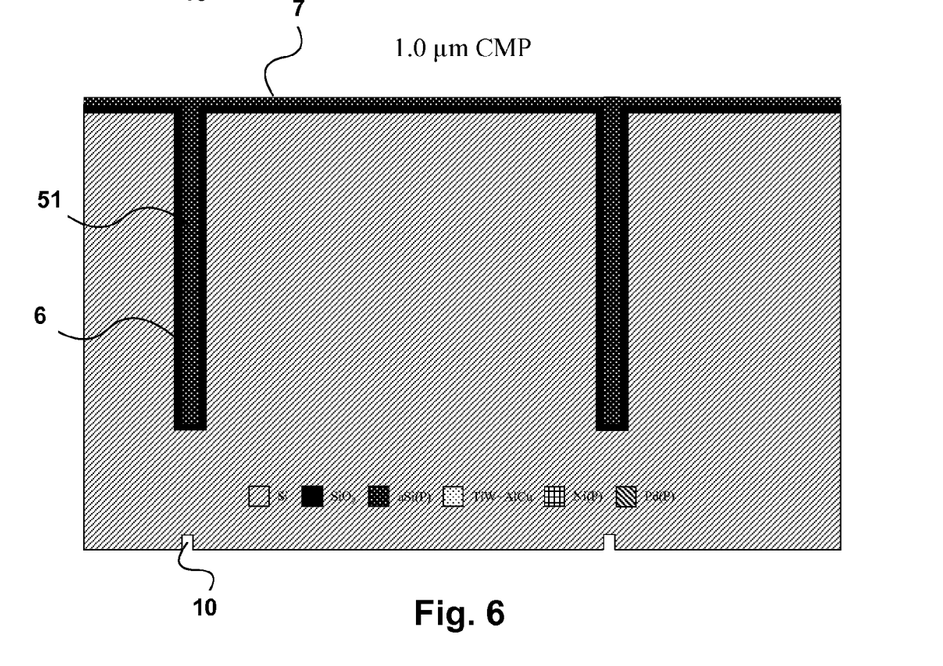
FIG. 6 illustrates the CMP polishing of the ISPD layer.

In a next step (FIG. 4), after stripping the mask 3, a 1.0 μm thermal oxide layer 6 is applied over the front side 4 of the substrate such that it extends into the silicon substrate 1 to line the walls of the vias 50. Next, as shown in FIG. 5, an LPCVD deposition is carried out to form an in-situ phosphorus doped amorphous silicon (ISPD) layer 7, which extends into the deep vias 50 to form conductive rods 51. This layer 7 is then reduced to a thickness of 1.0 μm by chemical mechanical polishing (CMP) as shown in FIG. 6. The CMP process removes the notches 7a formed over the vias 5.

Figure 7:
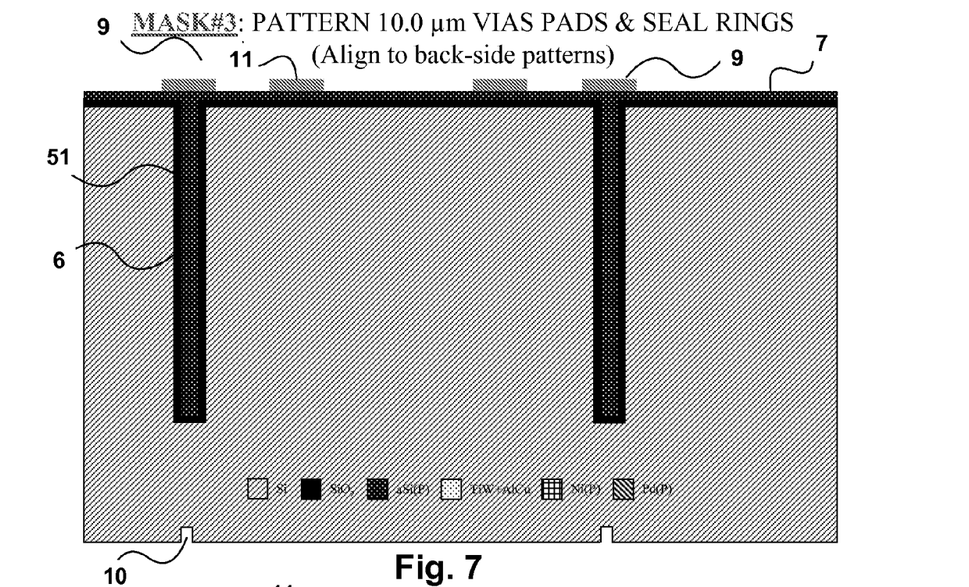
FIG. 7 illustrates patterning of the via pads and seal rings.
Figure 8:
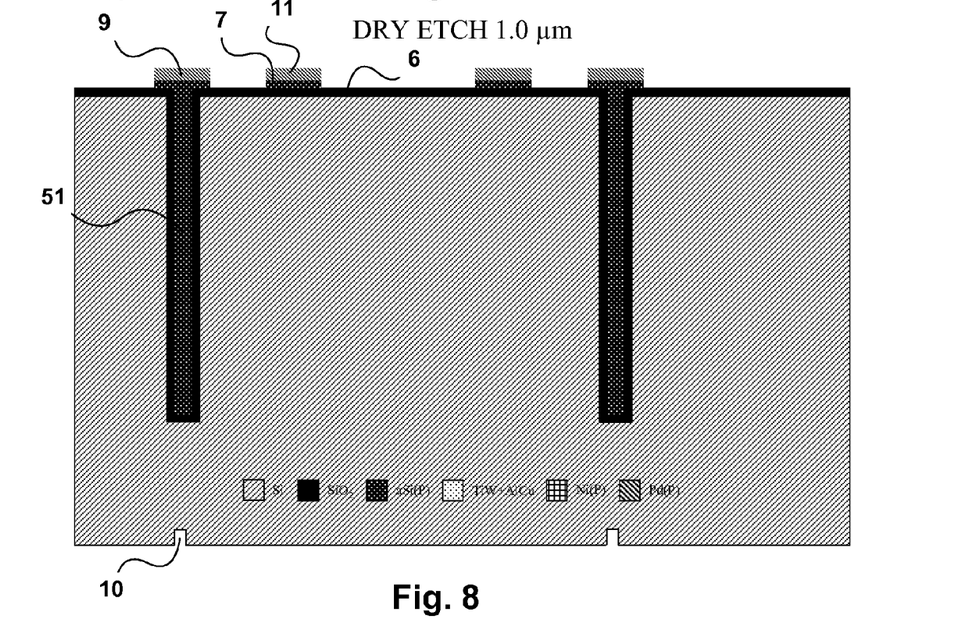
FIG. 8 illustrates the dry etch of the front side.
Figure 9:
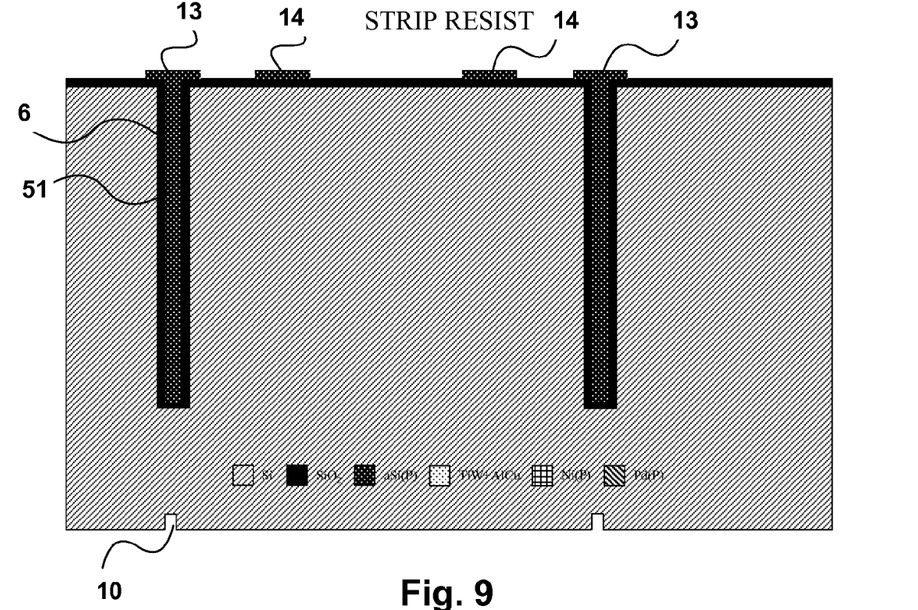
FIG. 9 shows the stripping of the resist layer.

Next, as shown in FIG. 7, a third mask is applied and patterned to create via pad mask regions 9 and seal pad mask regions 11. A dry etch is then performed to remove the ISPD layer 7 except under the mask regions 9 and 11 (FIG. 8). The mask is then stripped away to expose via pads 13 and seal rings 14 (FIG. 9). The pads 13 and seal rings are aligned relative to the backside notches 10.

The next step, shown in FIG. 10 is to flip over the substrate 1 and align it to preformed MEMS silicon wafer 15. This contains the MEMS components and has been preformed with seal rings 16 and pads 17 with cantilevered extensions 17a extending into the MEMS cavity 19. The pads and seal rings are formed on a thermal oxide layer 18. The structure of the wafer 15 is formed in a similar manner to the structure of the body 1.

Figure 11:
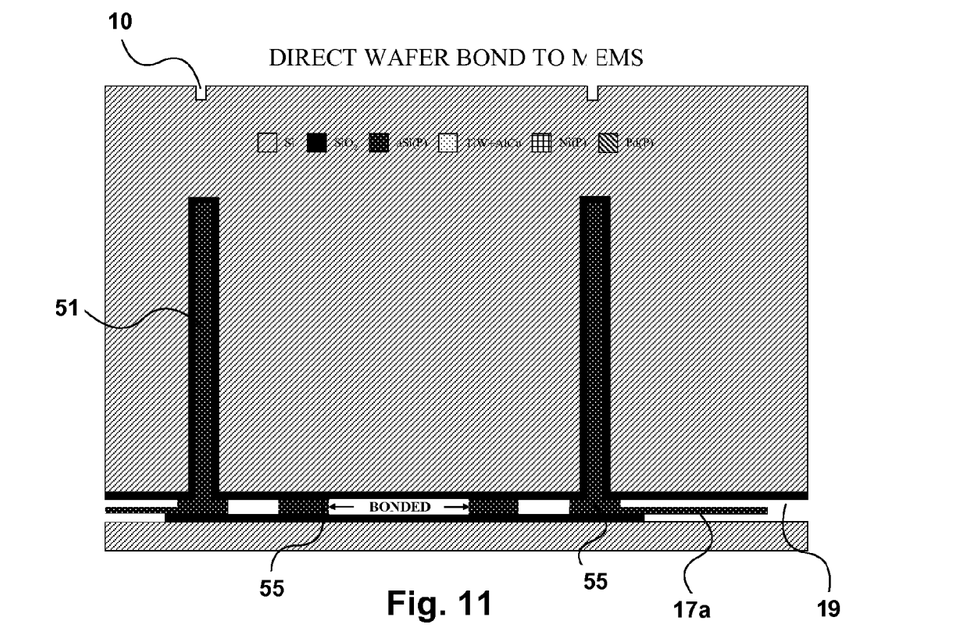
FIG. 11 shows the bonding of the two wafers.

Next, as shown in FIG. 11, the two parts, substrate 1 and MEMS wafer 15 are brought together so that the respective pads 13, 17, and seal rings 14, 16 come together and form a pressure bond 55 formed by direct contact between the amorphous silicon contact pads and seal rings respectively.

Figure 12:
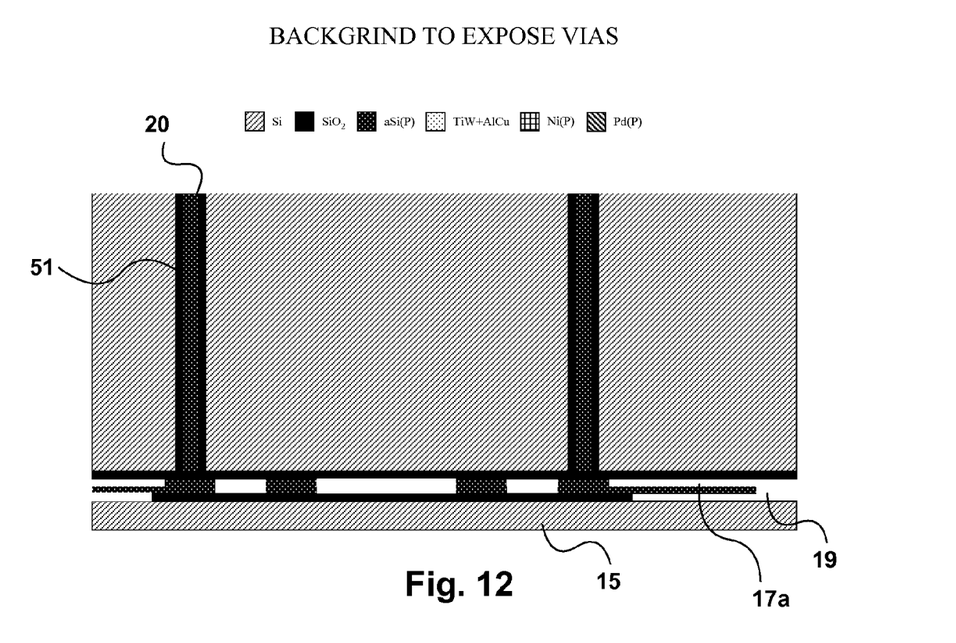
FIG. 12 shows the backgrinding of the lid wafer.

Next, as shown in FIG. 12, the backside, which is now on top, of the flipped substrate 1 is ground away to expose the ends 20 of the rods 51 remote from the cavity 19.

Figure 13:
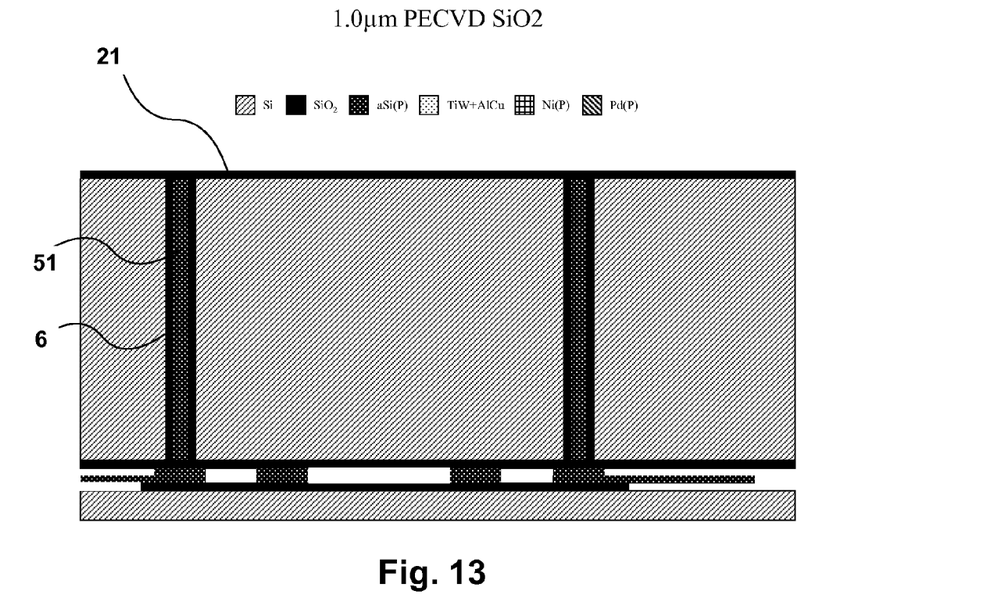
FIG. 13 shows the deposition of an oxide layer on the backside of the wafer.
Figure 14:
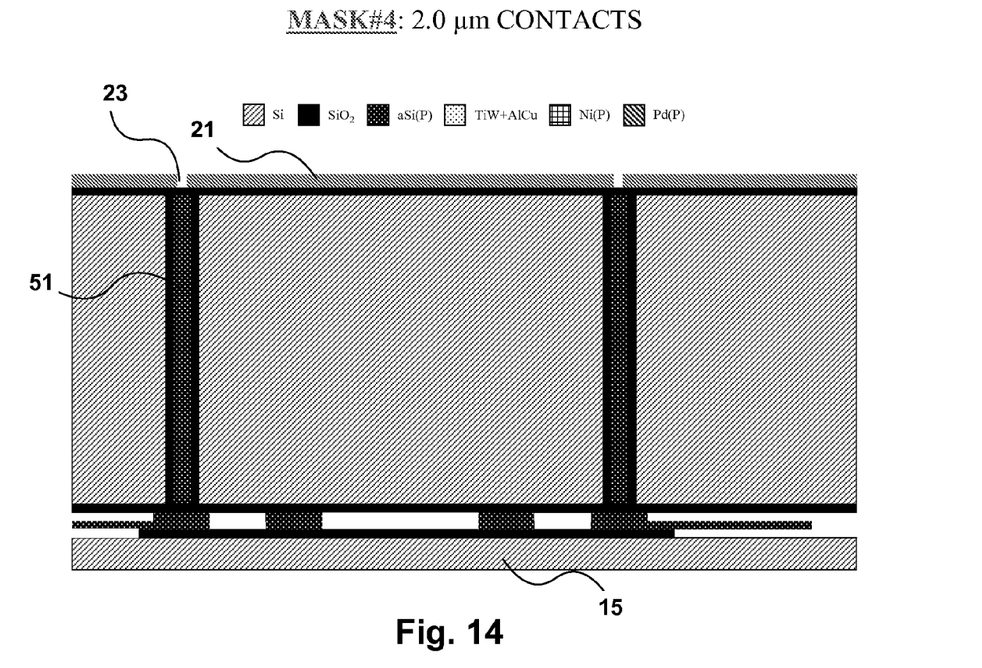
FIG. 14 shows the patterning of contact regions.
Figure 15:
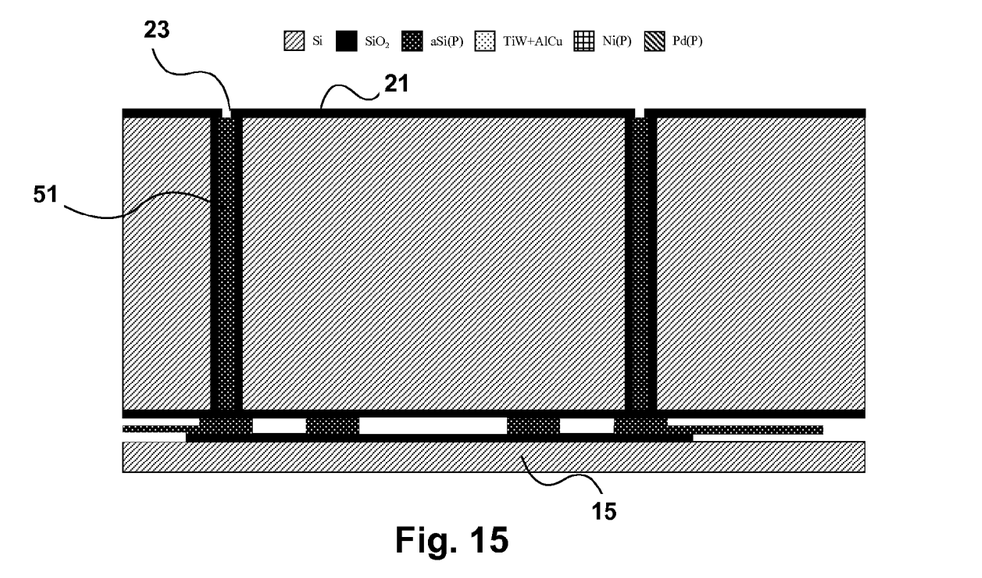
FIG. 15 shows the etching of the contact regions.

As shown in FIG. 13, the backgrinding is followed by the PECVD deposition of a $SiO_2$ layer 21, to which a fourth mask 22 is applied (FIG. 14). The fourth mask 22 is patterned to expose contact regions 23 over the rods 51. As shown in FIG. 15, the oxide layer 21 is etched away in the contact regions 23 to expose the ISDP material forming the rods 51 and the mask subsequently stripped away.

Figure 16:
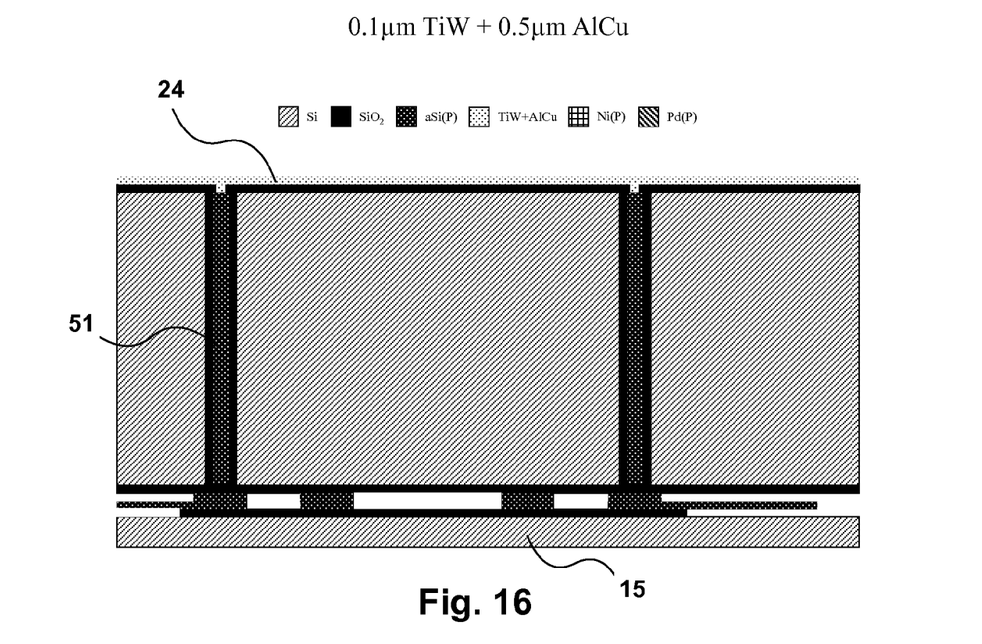
FIG. 16 shows the application of a metal contact layer.

The next step, shown in FIG. 16, is to deposit a conductive layer 24 over the oxide layer 21. In this embodiment, the conductive layer is a double layer consisting of a 0.1 μm TiW sublayer followed by a 0.5 μm AlCu sublayer. The separate sublayers are not shown in the Figure.

Figure 17:
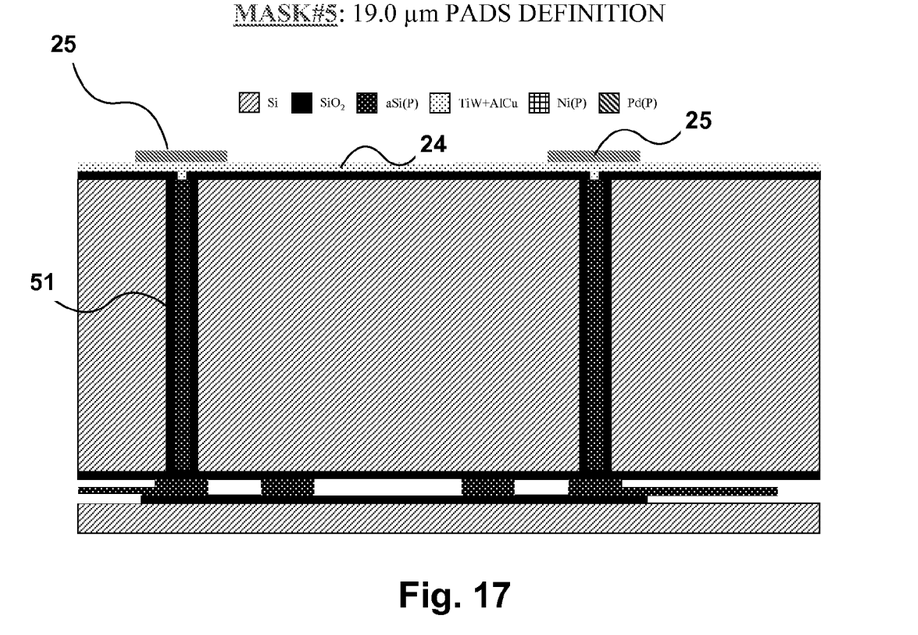
FIG. 17 shows the patterning of the contact pads.
Figure 18:
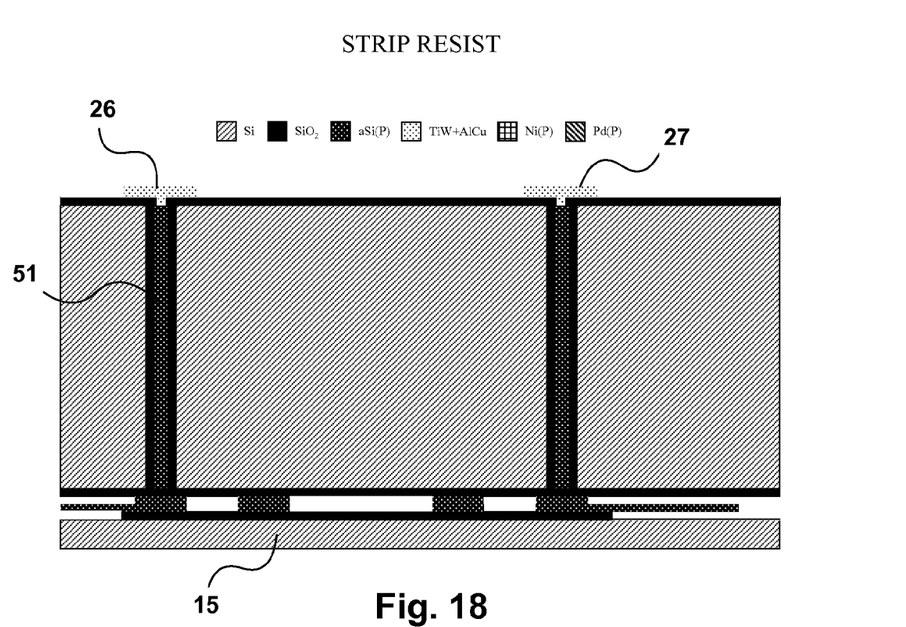
FIG. 18 shows the stripping of the resist.

Next, as shown in FIG. 17, a fifth mask is applied and patterned to form contact regions 25 over the vias 5. This is followed by a wet etch of the conductive layer 24 and subsequent stripping of the mask pad regions to expose the oxide layer 31 except in at the formed contacts 26 over the vias 5.

Figure 19:
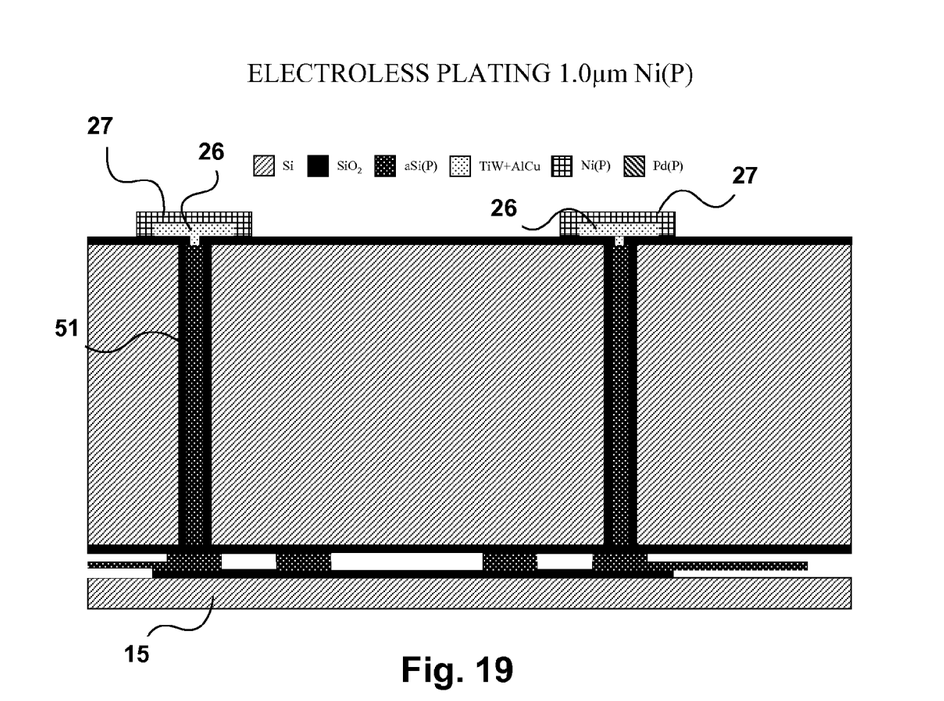
FIG. 19 shows the electroless plating of a first additional metal layer.
Figure 20:
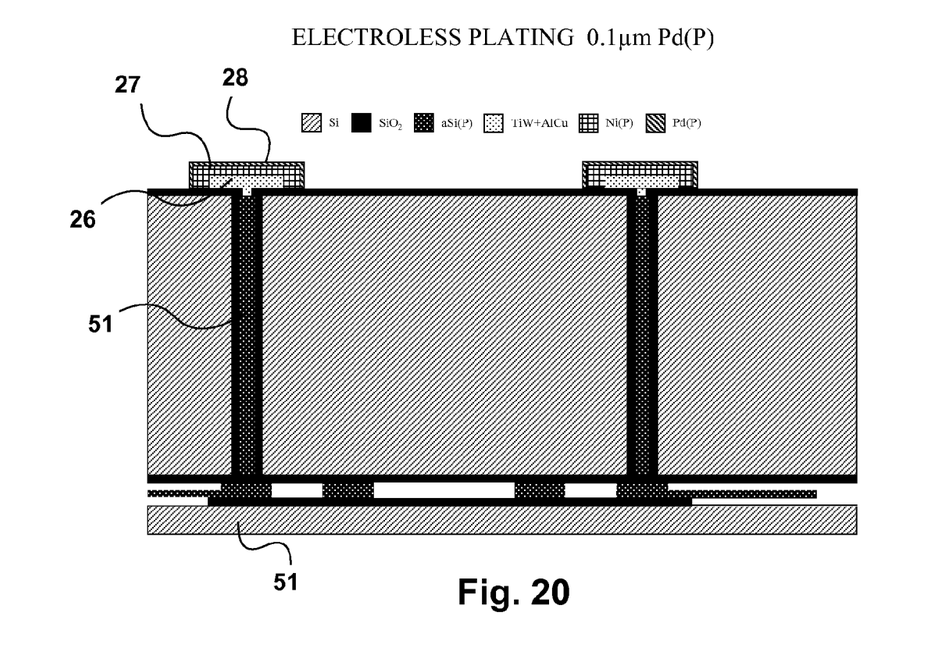
FIG. 20 shows the electroless plating of a second additional metal layer.

In a next step, shown in FIG. 19, a 1.0 μm layer 27 of Ni(P) is deposited by electroless plating over the contacts 26. Next, as shown in FIG. 20, a 0.1 μm layer 28 of Pd(P) is deposited by electroless plating over the layer 27. In a final step, shown in FIG. 21, the structure is diced and prepared for flip-chip bonding onto an FGBA (Fine-Ball-Grid-Array). As noted in FIG. 21, while the seal rings provide a hermetic seal, it is not critical that the bond to contact pads connected to the rods be hermetic because the material fills the vias extending to the surface and thus effectively prevents leakage into the cavity.

Figure 21:
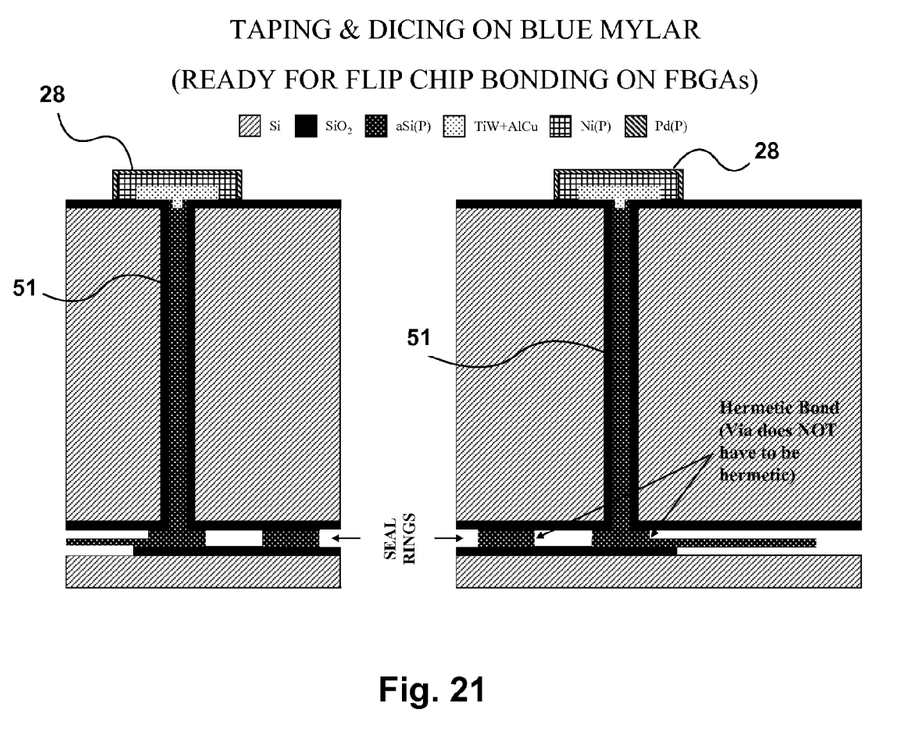
FIG. 21 shows the dicing of the wafer into individual components.

It will be noted that while the bond between the pads and the seal rings is hermetic, the via itself does not have to be hermetically sealed because it is filled with the ISPD material which provides a conductive path to the contact 17a within the cavity 30 of the MEMS device.

EXAMPLE

In a particular embodiment, if we assume that the resistivity of the aSi(P) rods within the vias is 800 μohm-cm, each via is 4 μm diameter and 100 μm tall, the resistance of the rods from bottom to top is then 800 μohm-cm×100 μm)/(3.14×4 $μm^2$)=63.7 ohm. Thus, a single via connecting the TiW/AlCu pad has a series resistance of about 65 ohm. An array of four vias (occupying an array of about 16 μm×16 μm) would have a resistance of 16 ohms, and an array of 64 vias (occupying an array of about 64 μm×64 μm) would have a resistance of 1 ohm.

A single via may be capped by a single 24 μm×24 μm sealing pad of aSi(P) (phosphorus doped amorphous silicon) underneath of the LID wafer and a single 10 μm×10 μm sealing and connecting pad of TiW/AlCu. An array of 4 vias would be capped by a single 20 μm×20 μm sealing pad of aSi(P) underneath of the LID wafer and a single 20 μm×20 μm sealing and connecting pad of TiW/AlCu. Thus, improved hermetic sealing, improved mechanical robustness and lower connection resistance are achieved.

An array of 64 vias would typically be capped by a single 72 μm×72 μm sealing PAD of aSi(P) underneath of the lid wafer and a single 72 μm×72 μm sealing and connecting pad of TiW/AlCu. Such an arrangement results in an excellent hermetic seal, excellent mechanical robustness, and less then about 1 ohm connection resistance.

It will thus be appreciated that increasing the number of rods forming an array reduces the resistance of the connection. For example, with an array of 64 rods, the resistance of the connection to the sealed cavity can be reduced to one ohm.

Many variations of the invention are possible in accordance with the spirit of the invention. It will be appreciated that different materials from those illustrated in the drawings, which are purely exemplary, can be employed. For example, the metallic contacts 27 shown in FIG. 19 need to provide good electrical contact with the conductive material in the vias, but the actual composition is not critical. Any suitable metallic arrangement can be employed. Also, other methods of depositing the various materials can be employed.

Other features of the invention are lining the vias with an insulating material, such as $SiO_2$, since the material forming the parts, such as silicon, may have some degree of conductivity, forming the rods in the lid wafer, flipping the lid wafer prior to bonding with the MEMS wafer, and etching back the flipped wafer after bonding to expose the rods prior to forming the contacts. One skilled in the art on looking at the exemplary Figures will appreciate that the underlying principles can be implemented in many different equivalent ways.

It should be noted that the resist, thermal oxide, and aSi(P) shown in FIGS. 3, 4, 6, and 7, though not shown, will also be deposited on the back side of the wafer as well.

In FIG. 21, the beam 17a of the MEMs device is electrically connected to the rod 32 through the bonded sealing rings, which are also made of phosphorus-doped amorphous silicon. Since the via is filled with amorphous silicon, the cavity 30 of the MEMS device is effectively sealed.

The invention claimed is:

1. A method of making a wafer level package for a MEMS device including a silicon MEMS wafer and a silicon lid wafer bonded together to form a hermetically sealed cavity, comprising:
   performing a deep reactive ion etch on a front side of said lid wafer to form vias extending part way into said lid wafer;
   forming a layer of thermal silicon oxide on said front side so that said thermal silicon oxide extends into said vias to line walls thereof;
   subsequently depositing a layer of phosphorus-doped amorphous silicon on said layer of thermal silicon oxide by low pressure chemical vapor deposition so that said layer of phosphorus-doped amorphous silicon extends into said vias to fill said vias and thereby form rods of phosphorus-doped amorphous silicon surrounded by said thermal oxide;
   etching away said layer of phosphorus-doped amorphous silicon layer on said front side except over said rods to form phosphorus-doped amorphous silicon contact pads at the ends of said rods and to form seal rings in discrete regions on said front side;
   providing said silicon MEMS wafer with phosphorus-doped amorphous silicon seal rings and contact pads at locations corresponding to the seal rings and contact pads on the lid wafer, said phosphorus-doped amorphous silicon contact pads on said MEMS wafer having cantilevered extensions;
   bringing said lid wafer and said MEMS wafer together with said phosphorus-doped amorphous silicon seal rings and said contact pads of said respective wafers in alignment;
   forming a pressure bond between said seal rings and said contact pads of said respective lid and MEMS wafers to define a hermetically sealed cavity containing said cantilevered extensions;
   etching away a backside of said lid wafer to expose said phosphorus-doped amorphous silicon rods; and
   forming contacts pads on said exposed phosphorus-doped amorphous silicon rods to provide an electrical connection through said phosphorus-doped amorphous silicon rods to said cantilevered extensions in said hermetically sealed cavity.

2. A method as claimed in claim 1, wherein groups of said rods are arranged in arrays and connected in parallel.

3. A method as claimed in claim 1, wherein after exposing the rods on the backside of lid the wafer, an insulating layer is formed on the backside of the lid wafer, holes are etched through said insulating layer to expose ends of said rods, a conductive layer is deposited on said insulating layer so as to contact the exposed ends of said rods, and a further etch is carried out to remove said conductive layer except in the vicinity of the exposed rods to provide said contact pads on said exposed phosphorus-doped amorphous silicon rods.

4. A method as claimed in claim 3, wherein one or more additional conductive layers are electroless plated onto said conductive layer to form said contact pads on exposed phosphorus-doped silicon rods.

5. A method as claimed in claim 1, wherein said wafers are subsequently diced into individual MEMS devices.

* * * * *